United States Patent [19]
Clark, II

[11] Patent Number: 5,978,885
[45] Date of Patent: Nov. 2, 1999

[54] METHOD AND APPARATUS FOR SELF-TIMING ASSOCIATIVE DATA MEMORY

[75] Inventor: Airell R. Clark, II, Albany, Oreg.

[73] Assignee: Hewlett Packard Co., Palo Alto, Calif.

[21] Appl. No.: 08/920,395

[22] Filed: Aug. 29, 1997

Related U.S. Application Data

[63] Continuation-in-part of application No. 08/664,902, Jun. 17, 1996, Pat. No. 5,828,324.

[51] Int. Cl.[6] ................................................ G11C 15/00
[52] U.S. Cl. .......................... 711/108; 365/49; 365/203
[58] Field of Search .............................. 711/108; 365/49, 365/203

[56] References Cited

U.S. PATENT DOCUMENTS

| | | | |
|---|---|---|---|
| 3,701,980 | 10/1972 | Mundy | 340/173 |
| 4,780,845 | 10/1988 | Threewitt | 365/49 |
| 4,881,075 | 11/1989 | Weng | 341/87 |
| 5,175,543 | 12/1992 | Lantz | 341/51 |
| 5,373,290 | 12/1994 | Lempel et al. | 341/51 |
| 5,448,733 | 9/1995 | Satoh et al. | |
| 5,602,770 | 2/1997 | Ohira | |
| 5,859,791 | 1/1999 | Schultz et al. | |

FOREIGN PATENT DOCUMENTS

| | | | |
|---|---|---|---|
| 0 313 190 A3 | 7/1990 | European Pat. Off. | H03M 7/42 |
| 0 380 294 A1 | 8/1990 | European Pat. Off. | G06F 7/02 |

OTHER PUBLICATIONS

"Practical Dictionary Management For Hardware Data Compression", By Ziv & Lempel, Development of a Theme, Department of Computer Science & Engineering FR–35 University of Washington Seattle WA 98195, pp. 33–50.

"Compression Of Individual Sequences Via Variable–Rate Coding", By Jacob Ziv and Abraham Lempel, IEEE Transactions on Information Theory, vol. IT–24, No. 5, Sep. 1978.

*Primary Examiner*—Jack A. Lane

[57] ABSTRACT

A computer memory system provides self-timed precharging and output signal latching. The method and apparatus are useful in accelerating search cycles for associative data in a memory such as a content addressable memory (CAM) where single transition memory search and output signal encoding is required. Feedback is provided to initiate memory precharging as soon as an actual search of the memory ends rather than at a next system clock transition.

8 Claims, 10 Drawing Sheets

METHOD AND APPARATUS FOR SELF-TIMING ASSOCIATIVE DATA MEMORY

RELATED APPLICATIONS

This is a continuation-in-part of U.S. patent application Ser. No. 08/664,902, filed Jun. 17, 1996, U.S. Pat. No. 5,828,324 by Clark II for Match and Match Address Signal Generation in a Content Addressable Memory Encoder.

BACKGROUND OF THE INVENTION

1. Field of the Invention

The present invention relates generally to associative data storage and retrieval as, for example, in content addressable memory ("CAM") devices. More particularly, the invention relates to a CAM search mode of operation, and more specifically to a method and apparatus for a CAM circuit having self-timing functionality.

2. Description of Related Art

Random access memory ("RAM") is perhaps the most common form of integrated circuit memory available in the state of the art. However, RAM devices are not suited for use in systems which process associative data. The well known methodology of sequentially accessing data when reading from the RAM, where the data address is input and the data itself stored at the address is output, is inefficient for systems involving stored information involving pattern recognition, data compression, natural language recognition, sparse matrix processes, data-base interrogation, and the like, since the address associated with the desired stored data may not be known. For this type of data, it is more efficient to interrogate a memory by supplying a compressed subset of the desired data or a code representative of the full data set. The memory responds by indicating either the presence or absence of the desired data set and, if a match occurs, the respective address in the memory bank for that data set.

In the 1980's, another type of integrated circuit memory device was developed to have ambiguous, non-contiguous addressing and was dubbed the content addressable memory ("CAM"). See e.g., U.S. Pat. No. 3,701,980 (Mundy). In essence, for this type of associative data storage, the entire CAM can be searched in a single clock cycle, giving it a great advantage over the sequential search technique required when using a RAM device.

For example, a data string dictionary can be stored in a CAM and used in generating Lev-Zempel compressed output data (known in the art as "LZ," generically used for any LZ data compression technique; see "Compression of Individual Sequences Via Variable-Rate Coding", IEEE Transactions on Information Theory, 24(5):530–536, September 1978). The input data signal to the CAM would comprise a bit string representation of the data which is being searched for in the CAM. The output would be a signal indicative as to whether the data was found, e.g., a MATCH signal, and, if found, the location within the CAM array of memory cells, also referred to as the cam core, e.g., a MATCH_ADDRESS signal. Obtaining this MATCH and MATCH_ADDRESS information is done with a "match encoder."

The problem with CAM devices is that compared to RAM each individual cell structure is relatively complex. See e.g., U.S. Pat. No. 4,780,845 (Threewitt); incorporated herein by reference. Thus, for the same integrated circuit real estate, a CAM device can not match the density, speed, or low-power performance of a RAM device. Integrated circuit fabrication process improvements generally affect both types of devices equally, so that in relative terms, CAM architects can not do much to narrow the performance gap.

Many signals in the CAM are signals which will only transition in one direction between the start of a search cycle and the output of the MATCH and MATCH_ADDRESS. The time after the MATCH_ADDRESS is output and before the next CAM search is started must include returning the CAM cells to a pre-search state, referred to as "precharge time." For example, during precharge time, all output logic of the CAM is driven to a HIGH state, ready to be driven to its NO_MATCH state, a HIGH to LOW transition, in one direction during a search. If a search is initiated and completed in one clock period, the precharge time must be less than or equal to half the cycle. For example, in a 15-nanosecond ("ns") system clock period, the precharge has to be completed in less than 7.5 ns. Depending on CAM size, combinatorial input logic timing, and the like as would be known to a person skilled in the art, the CAM precharge setup allotment of time may even be much less.

Therefore, there is a need for a self-timed precharge method and apparatus for CAM devices.

SUMMARY OF THE INVENTION

In its basic aspects, the present invention provides a method for self-timing a computer data memory system having a single transition associative data memory device, a system clock providing a system timing signal, and a single transition output encoder for providing a memory data match signal and memory data match address signal, including the steps of: providing a memory search signal for starting a memory search and for disabling memory pre-transition state precharging; delaying the memory search signal until memory search is complete, providing a delayed memory search signal; using the delayed memory search signal, enabling said output encoder and using the delayed memory search signal as a feedback signal substantially simultaneously re-enabling memory precharging.

In another basic aspect, the present invention provides a self-timed computer memory system for associative data storage, search, and retrieval, the system including a system clock providing a system timing signal; an array of memory cells, including search driver circuitry and cell output precharge circuitry; encoder circuitry for providing array search match and array match address output signals based on array search results, the encoder circuitry having output encoder circuitry, encoder precharge circuitry, and output circuitry for latching the match and match address output signals; first circuitry connected to receive a signal indicative of a search request and the system timing signal and to transmit the signal to the search driver circuitry and cell precharge driver circuitry, for turning the search driver circuitry on and cell precharge driver circuitry off substantially simultaneously; second circuitry, connecting the array and the encoder, for substantially simultaneously turning off the encoder precharge circuitry and resetting first circuitry as soon as the encoder is enabled.

In another basic aspect, the present invention provides a content addressable memory (CAM) apparatus for a system having a system clock timing signal. Self-timing is provided in the apparatus using: a CAM device having an input and an output, an array of CAM cells, CAM search driver circuitry, and CAM precharging circuitry; a CAM output encoder having CAM array match signal and CAM array match address signal encoding circuitry connected to the CAM output and encoder precharging circuitry; a set-reset first flip-flop having set inputs connected for receiving the clock timing signal and a signal indicative of a search request, a reset input, and an output connected to the search driver circuitry and the precharging circuitry such that a set condition of the first flip-flop transmits a signal enabling a search of the array and disabling precharging of said array; and a set-reset second flip-flop having a set input connected for receiving a first delayed signal indicative of a search request and a reset input connected for receiving a first delayed signal indicative of disabling precharging and an output connected to the encoder precharging circuitry and to the first flip-flop reset input, wherein the first delayed signal indicative of a search request sets the second flip-flop and transmits a signal enabling encoding the CAM array output with the match signal and match address signal encoding circuitry and disabling the encoder precharging circuitry and resetting the first flip-flop, enabling the CAM precharging circuitry.

It is an advantage of the present invention that it provides a CAM precharge methodology that is self-timed, eliminating any auxiliary timing and precharging circuitry.

It is an advantage of the present invention that it provides a CAM precharge that permits circuit timing overlap with other, on-going circuit functions.

It is another advantage of the present invention that CAM core cell gates that are used to have only one direction of change during a CAM search can be unbalanced to change quickly in that direction and slower in the other, increasing the speed through the cells and decreasing the core search timing budget requirement.

Other objects, features and advantages of the present invention will become apparent upon consideration of the following explanation and the accompanying drawings, in which like reference designations represent like features throughout the drawings.

BRIEF DESCRIPTION OF THE DRAWINGS

FIGS. 2A, 2B, 2C are comparison schematic diagrams of detail for CAM core encoders as shown in FIG. 1 in which:

FIG. 2B represents an encoder in accordance with the invention of the parent application, and FIG. 2C shows a detail of FIGS. 2A and 2B.

FIGS. 3A and 3B in conjunction with FIGS. 4A and 4B are comparison schematic diagrams of final _encoders as shown in FIG. 1 in which:

The drawings referred to in this specification should be understood as not being drawn to scale except if specifically noted.

DESCRIPTION OF THE PREFERRED EMBODIMENT

Reference is made now in detail to a specific embodiment of the present invention, which illustrates the best mode presently contemplated by the inventor for practicing the invention. Alternative embodiments are also briefly described as applicable. As will be recognized by a person skilled in the art of digital electronic design, the exemplary digital logic selection for signal transitions can be reversed HIGH for LOW and LOW for HIGH as long as consistency is maintained. Thus, the specifics of the exemplary embodiment signal transitions should not be extrapolated as a limitation on the scope of the present invention.

Figure 1:
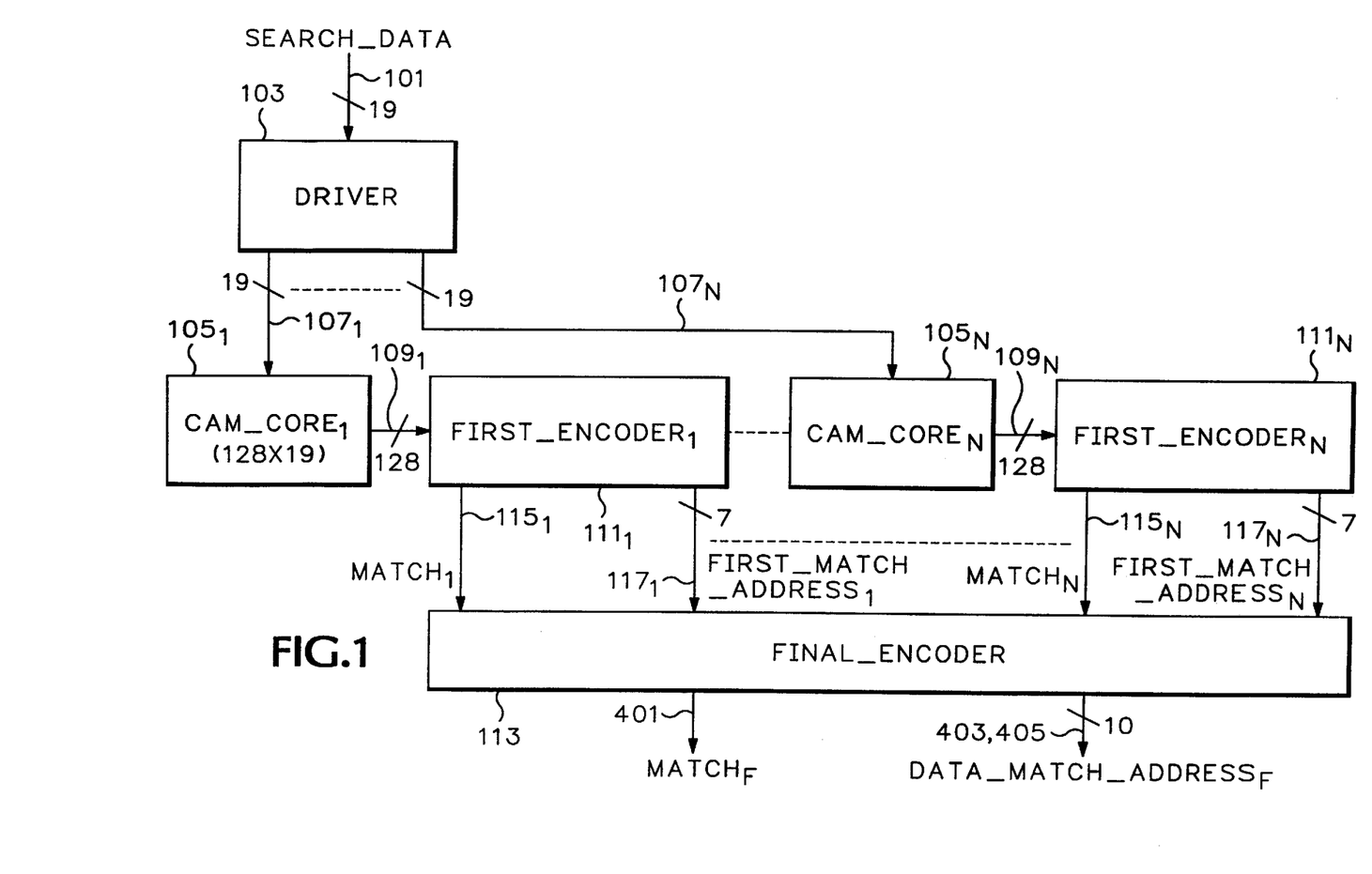
FIG. 1 is a schematic block diagram of a CAM system incorporating the invention of the parent application.

Turning now to FIG. 1, an exemplary embodiment of a CAM-based memory circuit is depicted. SEARCH_DATA on standard bus 101 is fed from the search engine (e.g., a central processing unit (not shown)) through a driver 103, comprising standard buffering hardware as would be known in the art, to drive the relatively high capacitance CAM core cell architecture.

Each CAM_CORE $105_1$–$105_N$ comprises an array of standard transistor-based cell circuitry and search circuitry as would also be known to a person skilled in the art. Each cell of the array stores one bit. In accordance with the exemplary embodiment, a total CAM of 768_words by 19_bits is described. It is assumed for the exemplary embodiment that due to integrated circuit layout constraints, that N=6; that is, six CAM_CORES $105_1$–$105_6$ of 128_ words by 19_bits each is provided. The SEARCH_DATA is input through standard buses $107_1$–$107_N$ to interrogate each CAM_CORE $105_1$–$105_N$. While for implementations for certain algorithms more than one CAM_CORE $105_1$–$105_N$ could have a MATCH, it is assumed in this exemplary embodiment implementation that only one cell on one CAM_CORE $105_1$–$105_N$ contains the data set of interest. Thus, if any, there will be only one MATCH$_x$ signal and one corresponding FIRST_MATCH_ADDRESS$_x$.

Perhaps the most critical path through a system circuit using a CAM is the search cycle; that is, the time from receipt of an input data search signal, or code, to the encoder input to determine if the CAM has the desired data set to the time of the output of a match or mismatch indication, and, if a MATCH signal is generated, the MATCH_ADDRESS. In general, it is known to precharge the CAM_CORE prior to starting a search; for example, the signal lines to each cell of the CAM array are precharged to all HIGH, approximately to the system voltage, $V_{DD}$. Match detection and encoder circuitry can then determine which cells are transitioning during the cycle, providing the MATCH and MATCH_ADDRESS. Each CAM_CORE $105_1$–$105_N$ has an output bus $109_1$–$109_N$ with one line for each of the stored data words, viz. 128_words in the exemplary embodiment. If a mismatch occurs for any location, the output bit for that location is pulled to LOW to indicate a mismatch; thus, if an output stays HIGH, it indicates a MATCH. If there is no match, all outputs go LOW. Thus, for each CAM_CORE $105_1$–$105_n$, one hundred and twenty eight outputs on respective buses $109_1$–$109_N$ tell whether a particular address in that cell array is a MATCH or a MISMATCH. The output signal derivation for each CAM_CORE output of the six device memory bank is accomplished using a memory FIRST_ENCODER $111_1$–$111_N$.

The one hundred and twenty eight outputs of the six CAM_COREs $105_1$–$105_6$ now need to be turned into a final match signal, MATCH_SIGNAL$_F$, 401 and CAM address, DATA_MATCH_ADDRESS$_F$, 403, 405 signal, preferably in one clock cycle, where DATA_MATCH_ADDRESS$_F$ is both the address of a particular CAM_CORE $105_x$ and its cell array address, FIRST_MATCH_ADDRESS$_x$. Assuming again only one MATCH designation for one CORE_CORE $105_1$–$105_N$ of the memory bank, CAM_CORE$_1$ $105_1$ through CAM_CORE$_N$ $105_N$, a MATCH$_F$ signal and an appropriate DATA_MATCH_ADDRESS$_F$ is derived using a FINAL_ENCODER 113.

Figure 2A:
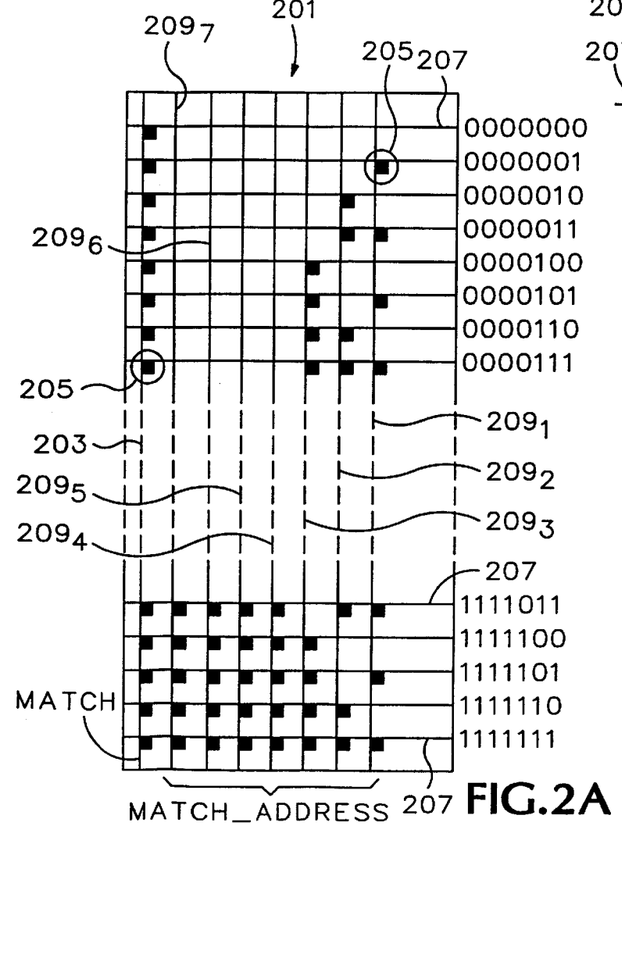
FIG. 2A represents a traditional encoder design.
Figures 2B, 2C:
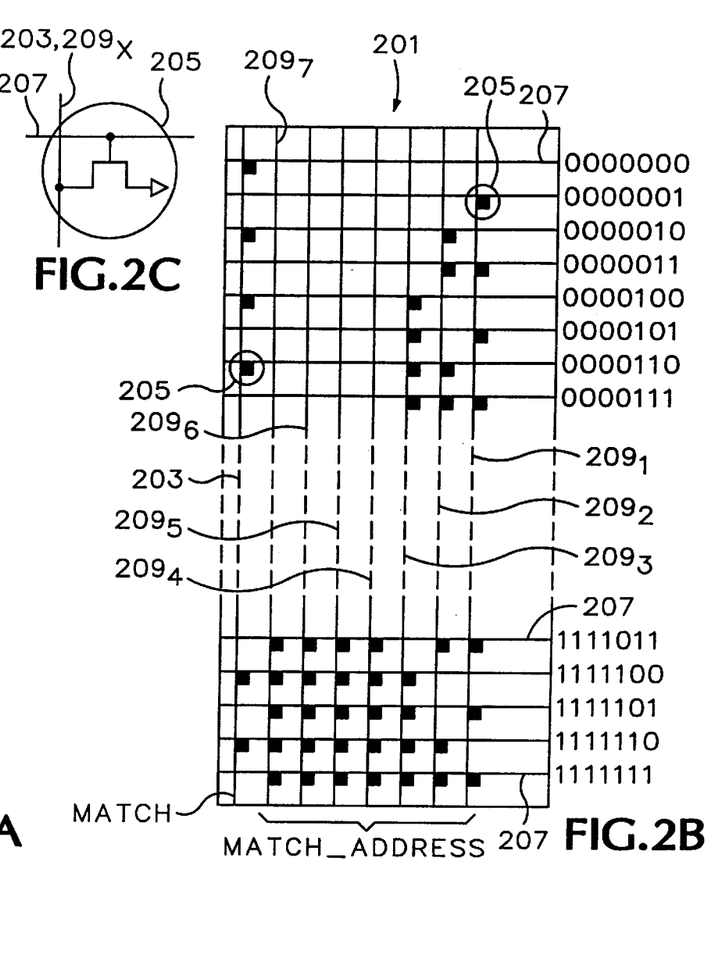
Figure 3A:
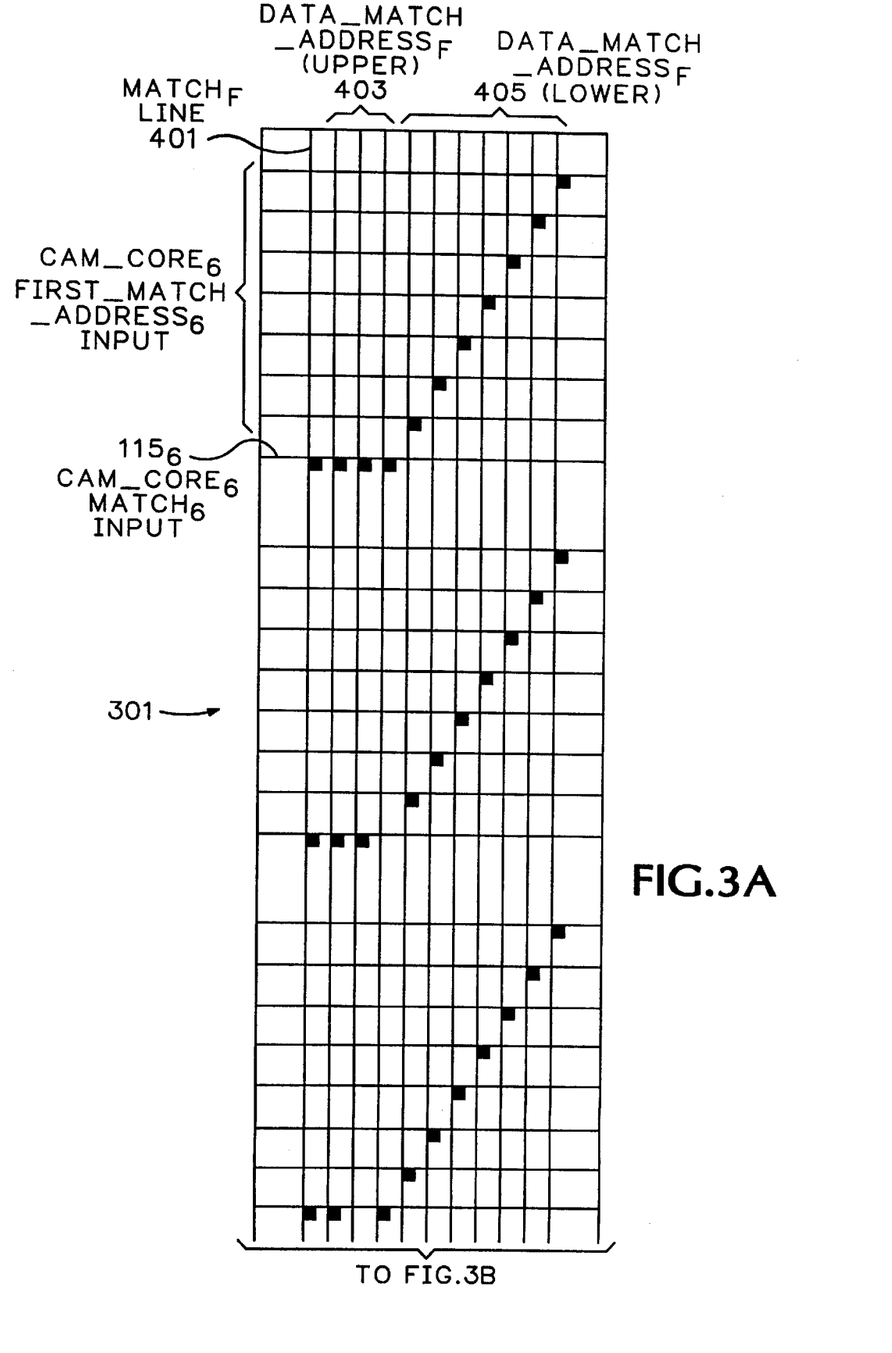
FIGS. 3A–3B represent a traditional final _encoder design.
Figure 3B:
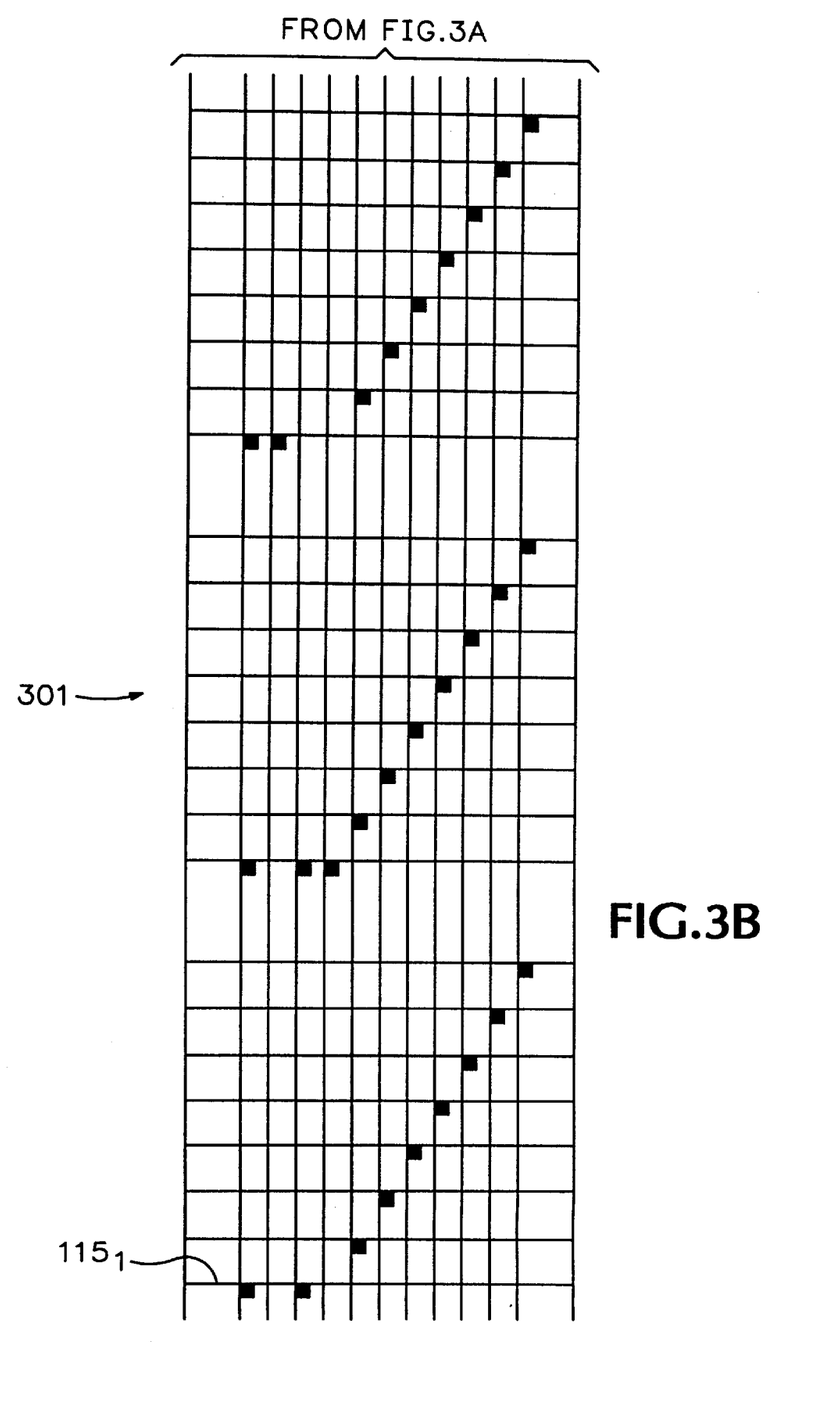
Figure 4A:
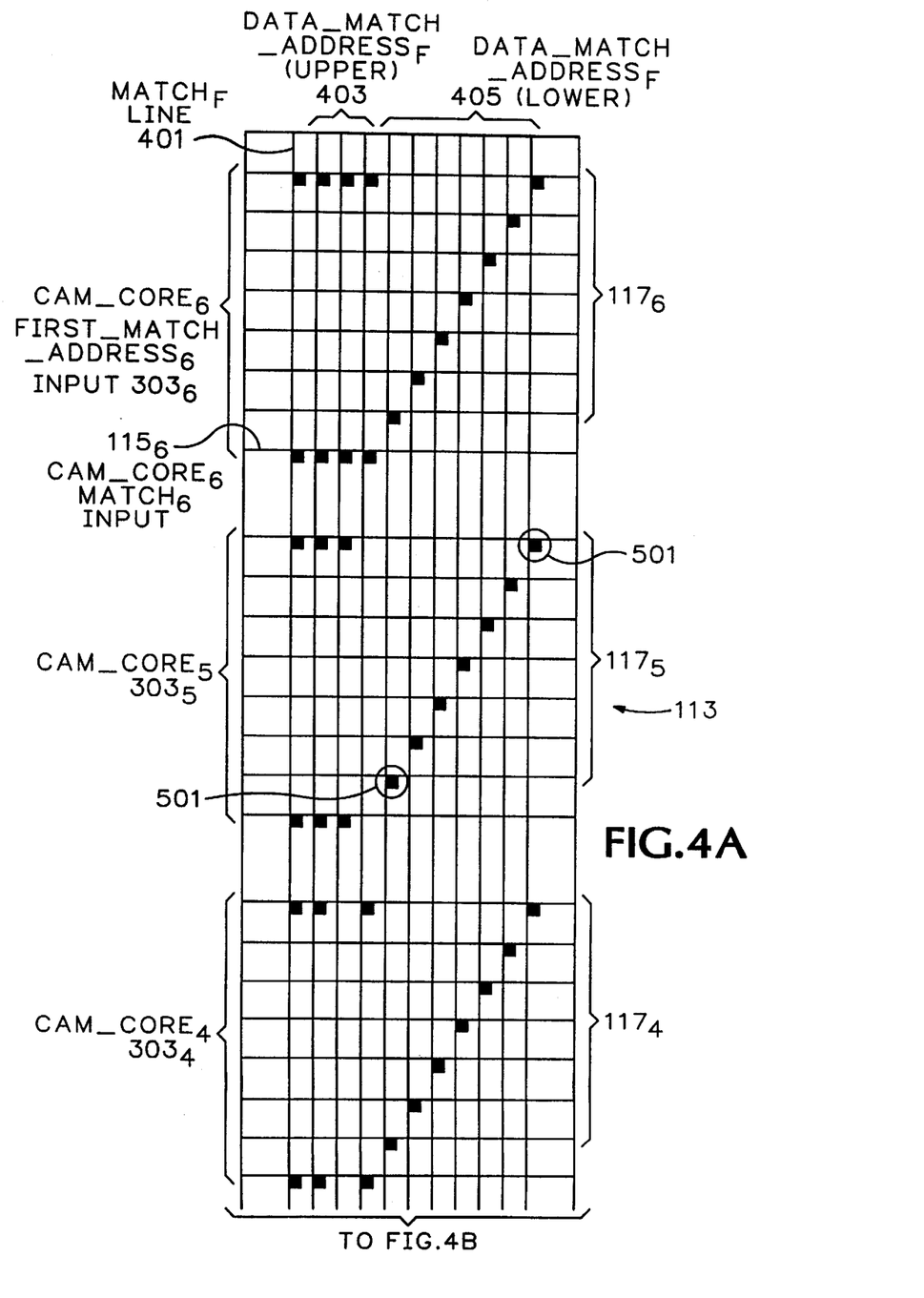
FIGS. 4A–4B represent a final _encoder in accordance with the invention of the parent application as shown in FIG. 1.
Figure 4B:
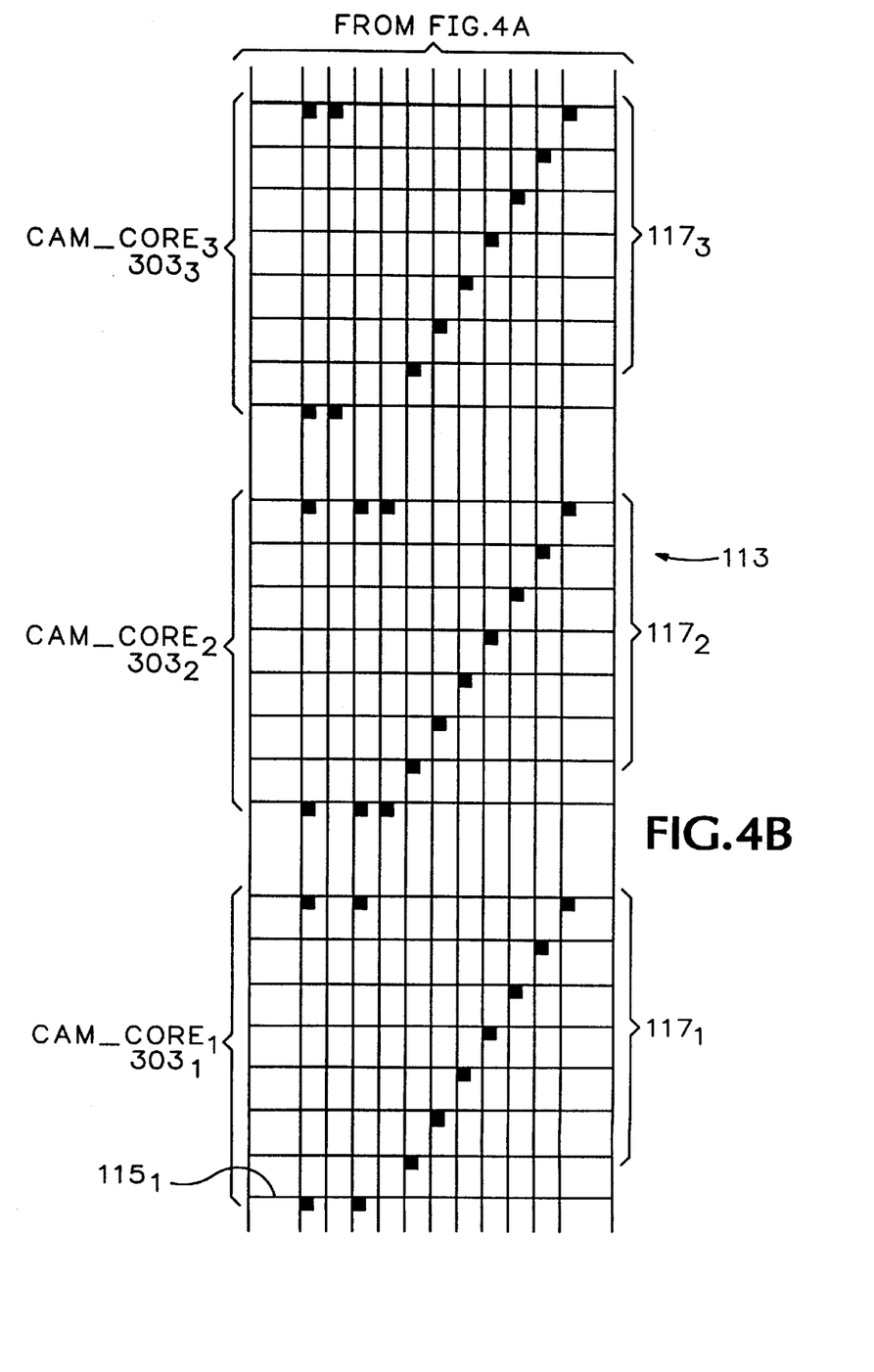

Turning now to FIGS. 2A and 2B, a standard CAM encoder 201, FIG. 2A, is shown. Such an encoder 201 is used in a CAM system such as shown in the assignee's U.S. Pat. No. 5,373,290 (Lempel et al.) as element 194, FIG. 5, explained beginning in column 12, line 28 et seq., incorporated herein by reference in its entirety. In the encoder 201, a MATCH line 203 has a pull down transistor 205, configured as in FIG. 2C, one for each of the one hundred and twenty eight data words in each CAM_CORE $105_1$–$105_N$. Likewise, one hundred and twenty eight CORE_MATCH lines $207_{0000000}$ (location zero) through $207_{1111111}$ (location 127) are multiplexed to the MATCH line 203, from a least significant bit ("LSB") MATCH_ADDRESS line $209_1$ through a most significant bit ("MSB") MATCH_ADDRESS line $209_7$, in essence a multiplex wired OR configuration [note: as will be described hereinafter, seven bits will also form the lower address bits of a ten bit address from the FINAL_ENCODER 113, FIG. 1]. Thus, the MATCH line 203 has one hundred and twenty eight pull down transistors 205 (counted vertically in FIG. 2A), but each of the MATCH_ADDRESS lines $209_1$–$209_7$ has only sixty four pull down transistors.

Comparing this embodiment of the standard CAM encoder 201 in FIG. 2A to the FIRST_ENCODER 201 in accordance with the present invention as shown in FIG. 2B, the difference lies in that on MATCH line 203, pull down transistors 205 are provided only for one half of CORE_MATCH lines $207_{0000000}$ (location zero) through $207_{1111110}$ (location 126). For locations having no MATCH line 203 pull down transistors 205, a designated pull down transistor of the MATCH_ADDRESS lines $209_1$–$209_7$ are used to serve double duty, that is, also indicating a match condition when switched.

For example, as shown where every other MATCH line 203 has a pull down transistor 205, if the DATA of interest of the SEARCH_DATA is at location 0000011, a location having no MATCH line 203 pull down transistor 205 but using bit_0 to do the double duty, since only one location of the CAM_CORE is ever a match, no conflicts will occur. That is, if the CAM_CORE has set the MATCH_ADDRESS at location 0000011, bit_0 has change state, indicating a MATCH. As another example, if the most significant MATCH_ADDRESS bit is used for the double duty, only the top sixty-four MATCH lines 203 require pull down transistors 205. Thus, use of one of the MATCH_ADDRESS bits as also indicating a MATCH when a true match has occurred in this manner reduces the number of pull down transistors on the MATCH line 203 to sixty-four. As a result, the MATCH line 203 will be as fast as the MATCH_ADDRESS lines 209.

In a commercial implementation having a search access time of approximately 6 nanoseconds, an improvement of approximately 0.5 nanosecond has been found to be achieved.

Recall that the present exemplary embodiment as shown in FIG. 1 uses a bank of six CAM_CORES $105_{1-6}$, each with its own FIRST_ENCODER $111_{1-6}$. Now each of the output signals MATCH$_{1-6}$ on each FIRST_ENCODER_MATCH output bus $115_{1-6}$ and its appurtenant FIRST_MATCH_ADDRESS output bus $117_{1-6}$ needs to be encoded in order to obtain both a final MATCH$_F$ signal back to the CPU, indicating the data of interest has been found, and a DATA_MATCH_ADDRESS$_F$ specifying both the FIRST_MATCH_ADDRESS on bus $117_x$, where x=the CAM_CORE$_{0-127}$ location which generated a MATCH signal, and a designation of which of the six CAM_CORES $105_{1-6}$ generated a MATCH signal. This function is accomplished in the FINAL_ENCODER 113 by adding three upper address bits to the seven FIRST_MATCH_ADDRESS bits for the CAM_CORE 105 location where the full data of interest resides.

Turning to FIGS. 3A–3B and 4A–4B, a FINAL_ENCODER 113 for accomplishing this task is provided.

FIG. 3A again refers to an embodiment as shown in assignee's U.S. Pat. No. 5,373,290 as part of element 194, FIG. 5. In element 194, a final_encoder 301 for an array of six cam_cores has six sections, one designated for each cam_core of the array. As stated earlier, each FIRST_ENCODER $111_{1-N}$, FIG. 1, has an output line $115_{1-N}$ for a MATCH$_{3-N}$ signal and an output bus $117_{1-N}$ for a FIRST_MATCH_ADDRESS$_{1-N}$. Looking to both FIGS. 3A–3B and 4A–4B for comparison, and focusing on the section of FINAL_ENCODER 113, FIG. 1, for CAM_CORE$_6$ as an example of each section, the MATCH$_6$ signal on line $115_6$ provides an appropriate HIGH or LOW state signal to each respective FINAL_ENCODER 113 input subsection, CAM_CORE$_{1-N}$, $303_{1-N}$. Each FIRST_MATCH_ADDRESS 7-bit bus $117_{1-N}$ is likewise input to each FINAL_ENCODER 113 input subsection, CAM_CORE$_{1-N}$. That is to say, each CAM_CORE$_x$ has its respective FIRST_ENCODER $111_x$ output connected to a respective subsection of the FINAL_ENCODER 113 which will in turn provide the actual MATCH$_F$ signal and DATA_MATCH_ADDRESS$_F$ for the data of interest based on the SEARCH_DATA input.

Figures 5A, 5B:
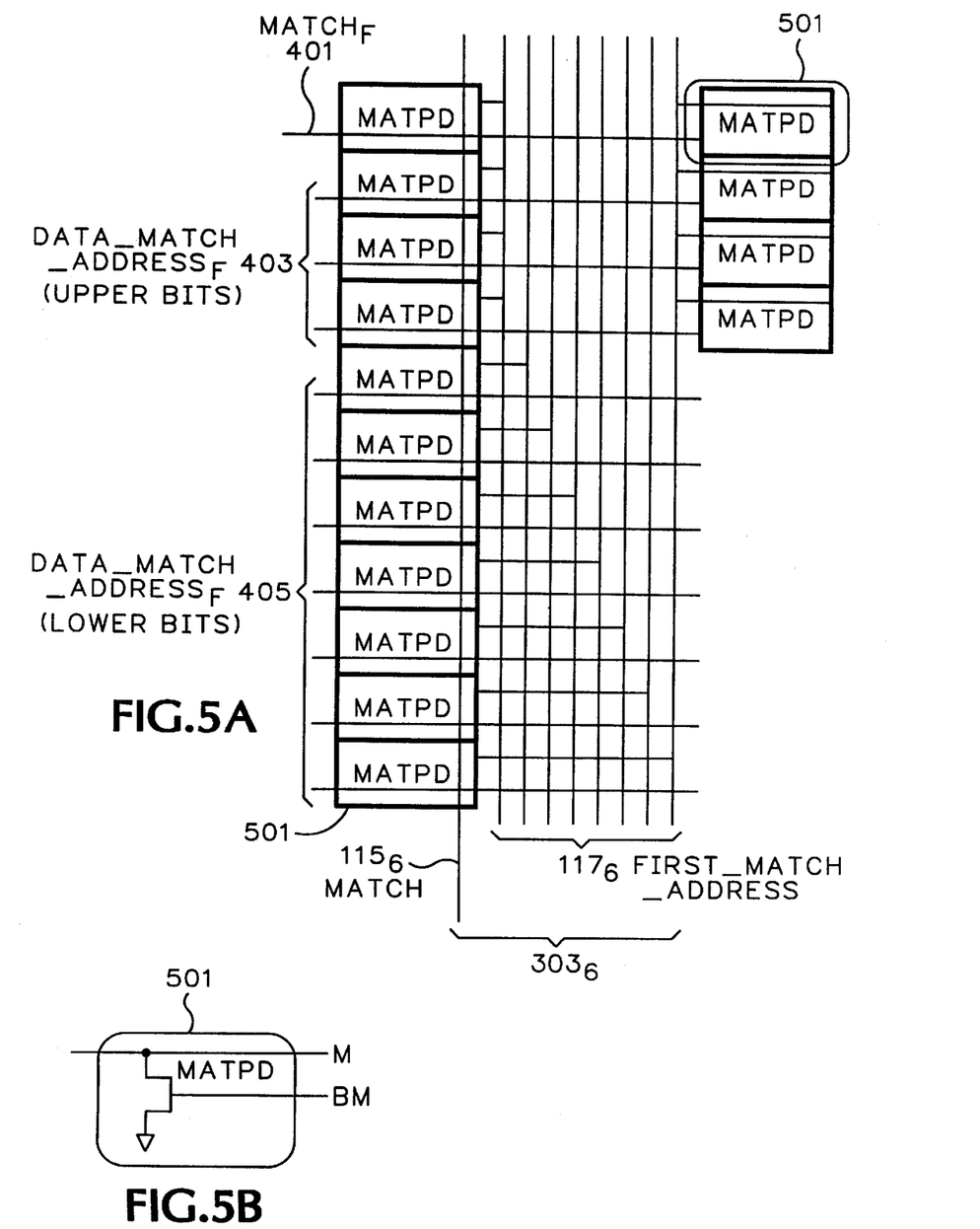
FIG. 5A is a detailed schematic of one final_encoder subsection for a CAM_CORE$_x$ as shown in FIG. 4B.
FIG. 5B is a detail of FIG. 5A.

Looking also to FIGS. 5A and 5B, detail for FINAL_ENCODER 113 subsection CAM_CORE$_6$ $303_6$ is depicted. The FINAL_ENCODER 113 is multiplexed with the inputs 115, 117 from the FIRST_ENCODER$_x$. Match signal pull down transistors 501 are provided in a manner such that when a MATCH$_6$ and FIRST_MATCH_ADDRESS$_6$ is received from a FIRST_ENCODER$_6$, the FINAL_ENCODER input subsection CAM_CORE$_6$ will provide both a MATCH$_F$ signal on FINAL_MATCH_LINE 401 and an expanded, 10-bit address for the data, DATA_MATCH_ADDRESS$_F$. In the example, the DATA_MATCH ADDRESS designates the CAM_CORE$_6$ in its added upper three bits on DATA_MATCH_ADDRESS$_F$ upper bit lines $403_{1-3}$, and pass through the FIRST_MATCH_ADDRESS$_6$ on DATA_MATCH_ADDRESS$_F$ lower bit lines $405_{1-7}$ (with reversal of all signal levels, HIGH to LOW and LOW to HIGH if necessary to use standard logic where HIGH=1).

Returning to FIGS. 3A–3B and 4A–4B, each CAM_CORE$_x$ can be compared and it can be seen that the removal of half of the pull down transistors 205 on FIRST_ENCODER_MATCH lines 207 in FIG. 2B for providing the MATCH$_x$ signal has been added back in the FINAL_ENCODER 113 on MATCH$_F$ lines 401. However, it has been found that this arrangement in the critical path in the present invention as shown in FIGS. 2B, 4A–4B, and 5A–5B provides an improvement of in reducing the cycle time approximate ten percent over the arrangement of FIGS. 2A, 3A–3B in a synergistic manner.

For some implementations the assumption that only one matching data set will be found is not true. Prioritization— selection of one of a possible plurality of the matching data sets—must be accomplished to prevent an unresolved contention and logic error. A priority encoder for the situation where there may be more than one match and match address follows, e.g., in a data compression implementation where multiple compression dictionaries are employed is shown in FIG. 8, where elements $811_0$–$811_N$ are analogous to element 611 for the purpose of explaining the invention in terms of a particular exemplary embodiment.

Generally speaking, since the memory output, for example, of a set of data compressions dictionaries stored in the CAM_CORES $105_0$–$105_N$, is deterministic, more than one core location can contain the data sought at a given time. As an example of use, assume there are two actual CAM devices, one holding data compression string information and the second holding status information, telling status of a particular dictionary, e.g., 00=previous dictionary, 01=current dictionary, 10=standby dictionary, 11=invalid. There is a one to one relationship between the string CAM and the status CAM. Status information tells which of the multiple dictionaries the information is actually in. (See e.g., U.S. Pat. No. 5,455,576, elements 40 and 28). The possibility of multiple matching entries in such a system is a distinct possibility.

Figure 8:
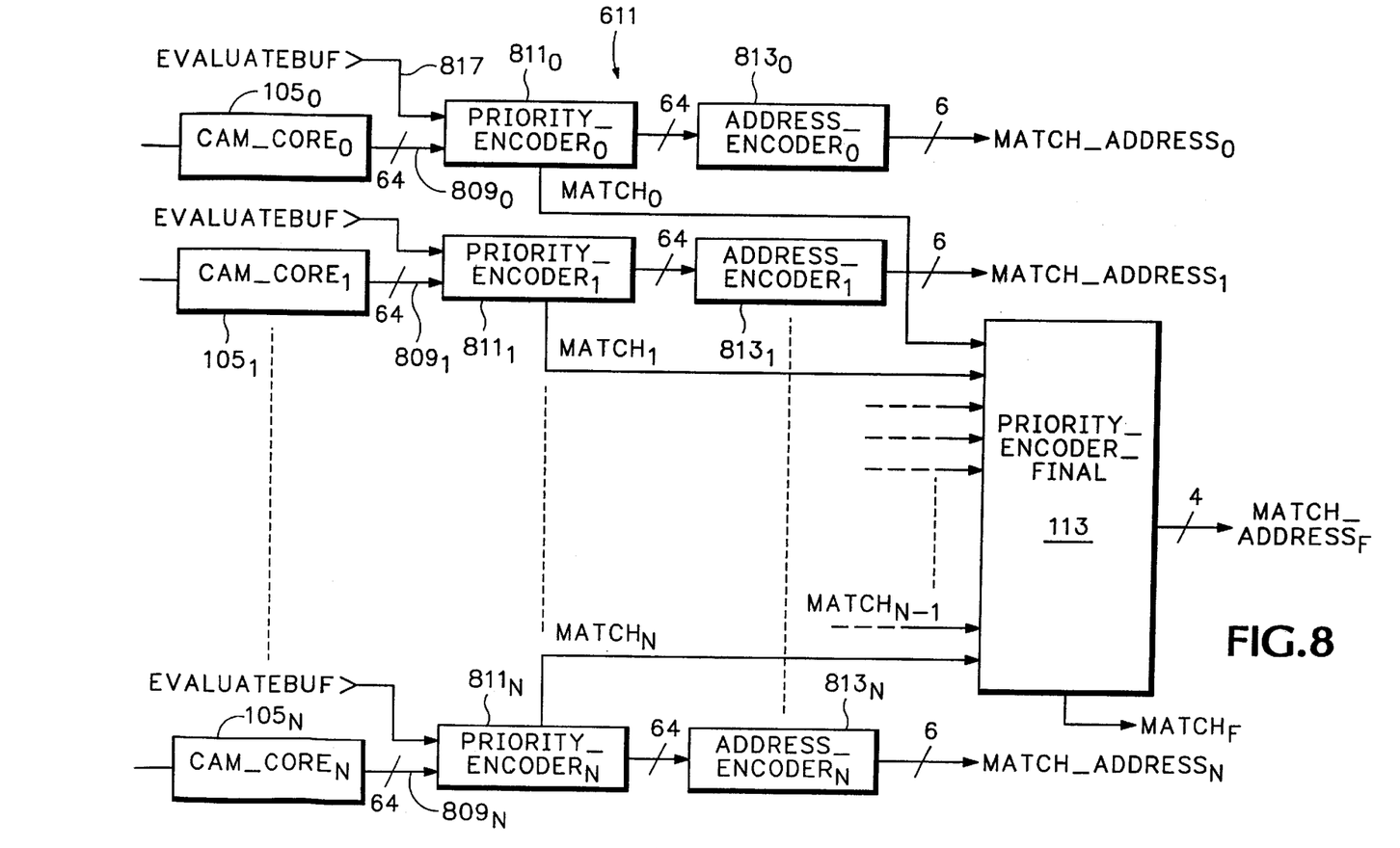
FIG. 8 is a detailed schematic block diagram of components of a subsystem in an alternative embodiment to the system as shown in FIG. 1 in accordance with the present invention.

While the CAM_CORES $105_0$–$105_N$ of CAM_CORE device 200 are shown in FIG. 8 as discrete devices, it will be recognized by a person skilled in the art that generally one memory cell array is used and for the purpose of the present invention is subdivided. For this example, let N=11, 768 inputs divided into twelve segments of 64. The present invention serves the function to provide both the MATCH signal and a 10-bit MATCH_ADDRESS signal to select the first location having the data sought. It will be recognized by those skilled in the art that this is a design expedient for purpose of describing the present invention and modifications can be made to develop other selection criteria for a different implementation; for example, for 1024 entries N=16 and circuitry expansion to develop a 10-bit MATCH_ADDRESS is required; that is the circuit sections are in a power of two, $2^n$, e.g., $2^{10}$=1024.

Signal convention hereinafter uses "N_" to indicate active low logic signals, "P_" for prioritized signals.

When the CAM_CORES $105_N$ have their respective 64-bit output bus lines $809_0$–$809_N$ (analogous to FIG. 1, elements $109_x$) set to output SEARCH_DATA results, and the EVALUATEBUF enable signal is set, priority encoding commences. Each CAM_CORE section has a possibility of one or more of its 64-match lines of the each bus line $809_{0-63}$ indicating either a HIGH if there is a MATCH at the connected location or a LOW if there is no match for that location.

The goal is to have the prioritizer circuit including PRIORITY_ENCODER $811_x$ and ADDRESS_ENCODER $813_x$ (analogous to FIG. 1, elements $111_x$) provide a MATCH and a MATCH_ADDRESS to only the first location where the data is to be found in a CAM_CORE $105_n$. MATCH signals appear in time relatively quickly following an EVALUATEBUF signal (see, e.g., and compare FIGS. 6, FIG. 7, waveforms circle-6 and circle-12, and FIG. 8 on line 817), whereas the MATCH_ADDRESS signals take longer to establish and output. By dividing the encoding functionality as follows, by the time six lower bits of a MATCH_ADDRESS are available, four upper bits are also generated such that the MATCH_ADDRESS provided is to the first location word lines of the first CAM_CORE of the bank having the required data. A FINAL_ENCODING 113' can be provided as explained heretofore.

Figure 6:
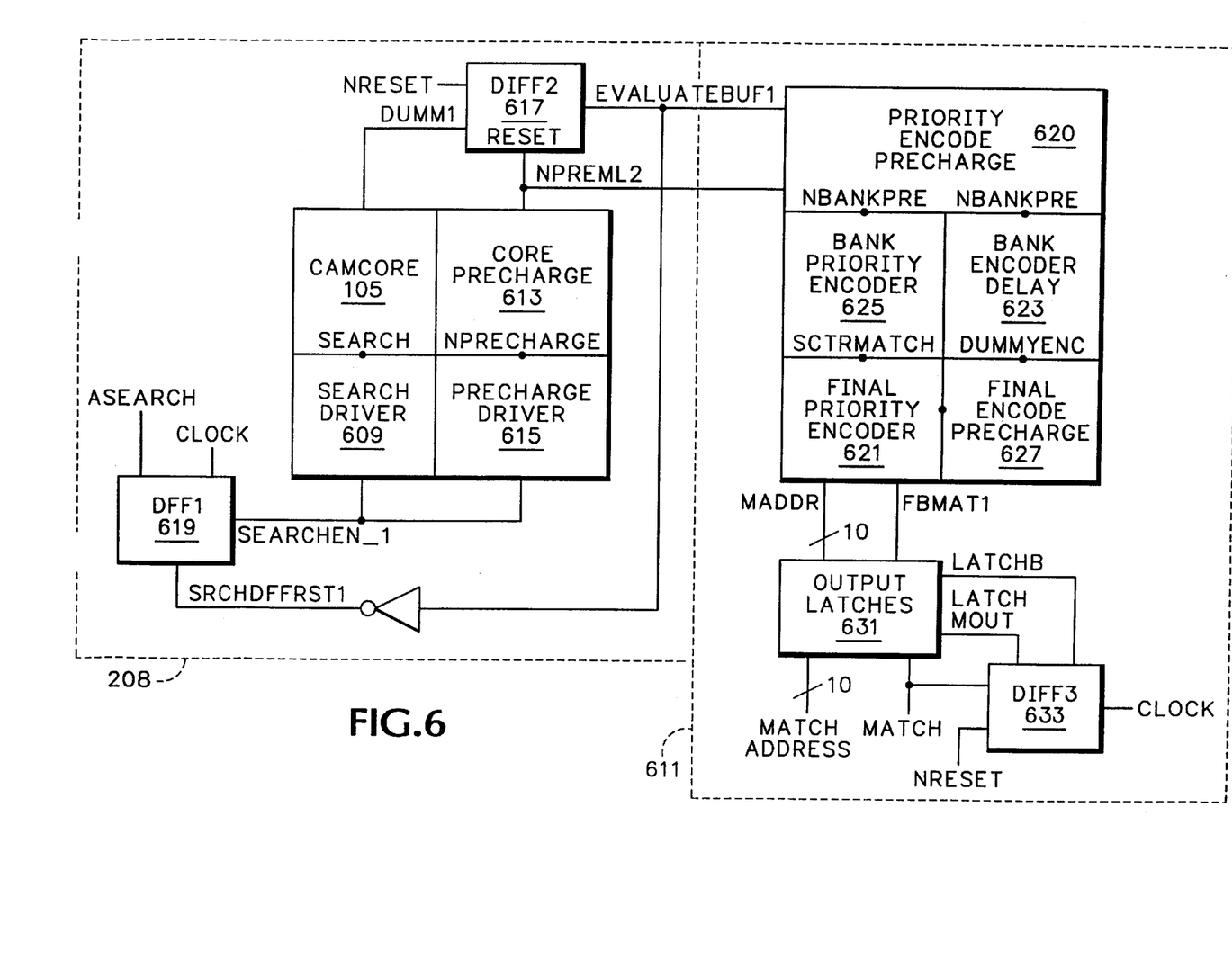
FIG. 6 is a schematic block diagram of a section of a CAM system incorporating the present invention.

Turning to FIG. 6, a preferred embodiment is shown of details of a CAM_CORE device 200 and ENCODER 611 device, block diagram, system architecture in accordance with the present invention.

Figure 7:
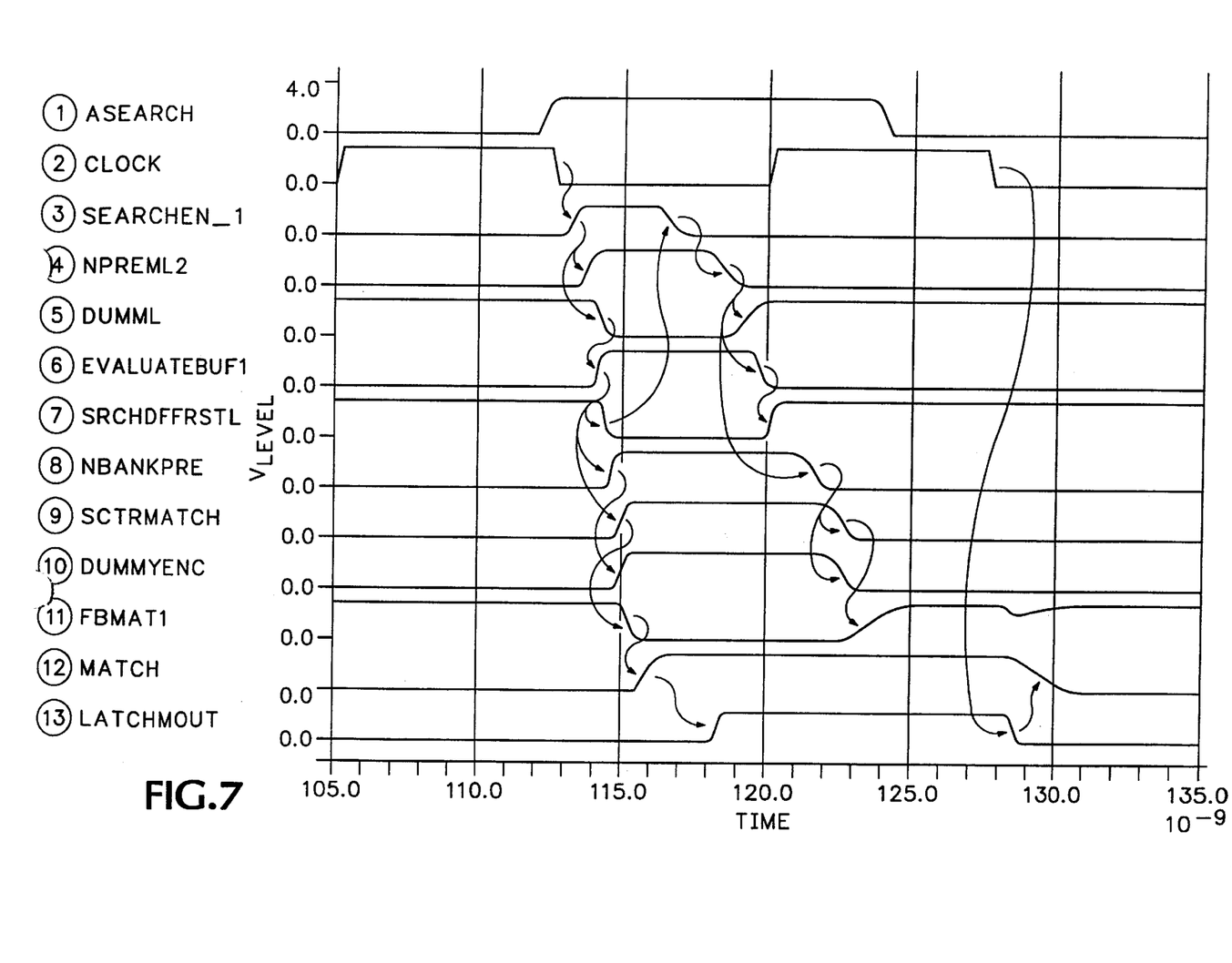
FIG. 7 depicts timing waveform diagrams for the present invention as shown in FIG. 6.

A signal timing diagram for the system architecture is shown in FIG. 7. While actual timing in a specific implementation will vary, and while actual signal occurrence timing will vary with fabrication process, voltage, and temperature ("PVT") fluctuations, relative signal occurrence timing is substantially constant as shown for the exemplary embodiment described throughout.

Referring to both FIGS. 6 and 7, waveform-2, the system is exemplified by a 15-nanosecond ("ns") system clock cycle. Assume that the chip logic output is a CAM search request, ASEARCH, waveform-1, having a rising edge occurring at t=112+. A next CAMCORE search is enabled, SEARCHEN_1, waveform-3, issued at the falling edge of the CLOCK signal, t=112.5. Assume further that the system is timed for a search of the CAM array to be accomplished in about 3.0 ns, and SEARCHEN_1 goes LOW, as explained hereinafter. During the remainder of the clock cycle, 12 ns, time must be budgeted for the CAM output and for the setting up for the next system clock cycle repeat, starting at t=127.5, where, absent the present invention, the next precharge can also be triggered. Thus, with only the clock transitions as triggers, CAM precharge would have to wait until the start of each new cycle Depending upon the CAMCORE size, system speed, and clock cycle budgeting for a specific implementation, there might not be enough time in such a budget to precharge the CAMCORE in this manner. However, if the CAM search time can be shortened and precharge can be initiated as soon as the actual search of the CAMCORE 207 ends, a greater precharge time can be made available in which to schedule and accomplish precharging.

An advantage to having a longer precharge time is that where only one transition of a cell gate of the CAMCORE is necessary during the clock cycle—viz., to indicate a match—the cells can be designed as unbalanced, i.e., to change more quickly in one direction. For example, a NAND gate that goes HIGH to LOW in 0.2 ns during the search and LOW to HIGH in 2.0 ns during precharge is acceptable when enough precharge time can be scheduled. Whereas a balanced gate might take 0.4 ns in each direction, by unbalancing the gate, the speed through the gate is thus doubled. Maximizing the precharge time allows a maximal unbalance factor in the gates, thereby maximizing search speed.

Returning to FIGS. 6 and 7, as CLOCK goes LOW, SEARCHEN 1 goes HIGH, t=113.0. This enables the SEARCH DRIVERS 609 and disables the CORE PRECHARGE circuitry 613, 615, NPRECHARGE going HIGH [Note that a signal name starting with N_, symbolizes an active LOW signal]. The CAMCORE precharge signal, NPREML2, waveform-4, goes HIGH, $t=_{113.5}$, turning the core precharge off, and DUMM1, waveform-5, goes LOW, t=114.0. The search signals thus pass through the CAMCORE 105 to block an edge-triggered, set-reset, flip-flop DFF2 617 which drives EVALUATEBUF1, waveform-6, HIGH, t=113.5. DFF2 617 and DFF3 633, detailed hereinafter, receive an system initialization signal, NRESET, whenever re-initialization is required, going LOW and clocking a HIGH respectively at that time.

Note from FIG. 6 that EVALUATEBUF1 also is inverted, becoming SRCHDFFRST1, waveform-7, feeding back and resetting the search enabling, edge-triggered, set-reset, flip-flop DFF1 619 at t=115+. Resetting flip-flop DFF1 619 drives SEARCHEN_1 LOW, t=117.3, disabling the SEARCH DRIVER 609 and enabling the PRECHARGE DRIVER 615 and CORE PRECHARGE 613 circuitry as NPREML2, waveform-4 goes LOW, t=118.0. The CORE PRECHARGE signal NPREML2 feeds DFF2 617 reset port and EVALUATEBUF1 goes LOW, t=199+. This portion of the CAM 200 system is thus back to its original state, ready for the next clock cycle to begin.

EVALUATEBUF1 going HIGH also triggers encoder signals, waveforms 8 through 13. While SEARCHEN_1 and EVALUATEBUF1 are HIGH, namely from t=113.0 to t=119+, the PRIORITY_ENCODER section 611 generates MATCH and MATCH_ADDRESS signals based on the CAMCORE 105 search results. EVALUATEBUF1 going HIGH turns off the precharge signal for a PRIORITY ENCODER 611, NBANKPRE, waveform-8, goes HIGH, t≅115.5, just as the MATCH signals from the CAMCORE 105, SCTRMATCH, waveform-9, are fed into the FINAL PRIORITY ENCODER 621 (see also FIG. 8, element 113'). Furthermore, EVALUATEBUF1 drives the BANK ENCODER DELAY 623, DUMMYENC waveform 10, which waits for the amount of time needed for the BANK PRIORITY ENCODER 625 to generate a MATCH signal, waveform-12, and send it to the FINAL PRIORITY ENCODER 621, then it turns off the FINAL ENCODER PRECHARGE 627 for the FINAL PRIORITY ENCODER 621.

When, following the end of a search cycle and SEARCHEN_1 goes LOW, NPREML2 goes LOW, t=118.0–119.0, restarting the precharge of the CAMCORE 107 cells, it also pulls the MATCH output lines from the CAMCORE to LOW and starts the precharge of the BANK PRIORITY ENCODER 625 as the PRIORITY ENCODE PRECHARGE 620 signal NBANKPRE goes low, t=121.0–122.0. As before, the precharge signal, NBANKPRE, feeds through the BANK ENCODER DELAY 623 and turns on the FINAL ENCODE PRECHARGE 627 just as the BANK PRIORITY ENCODER 625 stops driving the FINAL PRIORITY ENCODER 621. Sometime during this process time, the desired output MATCH and MATCH_ADDRESS signals appear on the output ports of the CAMCORE 105. The time at which this happens and the length of time these CAMCORE outputs remain valid is search process, voltage and temperature dependent.

The desired action is to hold the outputs until after the next CLOCK edge, t=127.5. This is done by placing OUTPUT LATCHES 631 on the FINAL PRIORITY ENCODER 621 outputs MADDR, waveform-13, LATCHMOUT, where the OUTPUT LATCHES 631 are set at t=118+ and release the latched bits at t=128+ following the CLOCK cycle falling edge at t=127.5, and FBMAT1, waveform-11.

The OUTPUT LATCHES 631 are also self-timed; an edge-triggered, set-reset, flip-flop DFF3 633 is triggered, LATCHMOUT, waveform-13, by the MATCH signal going HIGH, t=116.5–117.5, causing the MATCH and MATCH_ADDRESS signals to be latched. The OUTPUT LATCHES 631 remain closed until reset by the falling edge of the CLOCK at t=127.5. Note that if no match occurs on a particular search, the OUTPUT LATCHES 631 will not close since the CAMCORE 105 will continuously output the desired LOW values during a no match search cycle.

Thus, once the memory bank encoder has the data, the cam cores can start precharging. Once the final encoder has the data, the bank encoder can start precharging and one of the output latches can close, allowing the final encoder to start precharging. Conversely, the bank encoder does not stop precharging until the cam cores have search data to send. The final encoder does not stop precharging until the bank encoder has data to send. The output latches are set to open on the falling edge of the clock cycle rather than when the final encoder has data to send. Note that in an alternative embodiment the functionality can be reversed. The present invention provides a CAM search functionality which self-times CAMCORE precharge functions and latched output MATCH and MATCH_ADDRESS signals.

The foregoing description of the preferred embodiment of the present invention has been presented for purposes of illustration and description. It is not intended to be exhaustive or to limit the invention to the precise form or to exemplary embodiments disclosed. Obviously, many modifications and variations will be apparent to practitioners skilled in this art. The invention can be applied to associative data storage and retrieval in devices other than cam circuits. Similarly, any process steps described might be interchangeable with other steps in order to achieve the same result. The embodiment was chosen and described in order to best explain the principles of the invention and its best mode practical application, thereby to enable others skilled in the art to understand the invention for various embodiments and with various modifications as are suited to the particular use or implementation contemplated. It is intended that the scope of the invention be defined by the claims appended hereto and their equivalents.

What is claimed is:

1. A method for self-timing a computer data memory system having a single transition associative data memory device, a system clock providing a system timing signal, and a single transition output encoder for providing a memory data match signal and memory data match address signal, comprising the steps of:

providing a memory search signal for starting a memory search and for disabling memory pre-transition state precharging;

delaying said memory search signal until memory search is complete, providing a delayed memory search signal;

using said delayed memory search signal, enabling said output encoder and using said delayed memory search signal as a feedback signal substantially simultaneously re-enabling memory precharging.

2. The method as set forth in claim 1, further comprising the step of:

using said memory data match signal to latch said memory data match signal and memory data match address signal until a next system timing signal transition.

3. The method as set forth in claim 1, comprising the further steps of:

using said memory search signal to start precharging said output encoder; and using said delayed memory search signal to stop precharging said output encoder and enable encoding of memory search output transition signals.

4. A self-timed computer memory system for associative data storage, search, and retrieval, said system including a system clock providing a system timing signal, comprising:

an array of memory cells, including search driver circuitry and cell output precharge circuitry;

encoder means for providing array search match and array match address output signals based on array search results, said encoder means having output encoder circuitry, encoder precharge circuitry, and output circuitry for latching said match and match address output signals;

first means, connected to receive a signal indicative of a search request and said system timing signal and to transmit said signal to said search driver circuitry and said cell precharge driver circuitry, for turning said search driver circuitry on and said cell precharge driver circuitry off substantially simultaneously;

second means, connecting said array and said encoder means, for substantially simultaneously turning off said encoder precharge circuitry and resetting said first means as soon as said encoder means is enabled.

5. The system as set forth in claim 4, wherein said output encoder circuitry further comprises:

third means for latching said match and match address output signals such that said signals are held until a next system timing signal transition.

6. The system as set forth in claim 5, wherein said first means, said second means, and said third means are edge-triggered, reset-set flip-flop devices.

7. A content addressable memory (CAM) apparatus for a system having a system clock timing signal, comprising:

a CAM device having
an input and an output,
an array of CAM cells, CAM search driver circuitry, and
CAM precharging circuitry;

a CAM output encoder having
CAM array match signal and CAM array match address signal encoding circuitry connected to said CAM output and encoder precharging circuitry;

a set-reset first flip-flop having
set inputs connected for receiving said clock timing signal and a signal indicative of a search request,
a reset input, and
an output connected to said search driver circuitry and said precharging circuitry
such that a set condition of said first flip-flop transmits a signal enabling a search of said array and disabling precharging of said array; and a set-reset second flip-flop having
a set input connected for receiving a first delayed signal indicative of a search request and
a reset input connected for receiving a first delayed signal indicative of disabling precharging and
an output connected to said encoder precharging circuitry and to said first flip-flop reset input,
wherein said first delayed signal indicative of a search request sets said second flip-flop and transmits a signal enabling encoding said CAM array output with said match signal and match address signal encoding circuitry and disabling said encoder precharging circuitry and resetting said first flip-flop, enabling said CAM precharging circuitry.

8. The apparatus as set forth in claim 7, further comprising:

each CAM cell including unbalanced gates having search time specifications substantially shorter than precharge time specifications such that search time is minimized.

* * * * *